United States Patent
Holbe

(10) Patent No.: US 9,013,862 B2
(45) Date of Patent: Apr. 21, 2015

(54) MODULE ASSEMBLY FOR THE APPLICATION-SPECIFIC CONSTRUCTION OF POWER FACTOR CORRECTION SYSTEMS, FILTER SYSTEMS, AND ABSORPTION CIRCUIT SYSTEMS

(75) Inventor: Klaus Holbe, Obermaiselstein (DE)

(73) Assignee: System Electric GmbH, Linsengericht-Altenhasslau (DE)

( * ) Notice: Subject to any disclaimer, the term of this patent is extended or adjusted under 35 U.S.C. 154(b) by 241 days.

(21) Appl. No.: 13/641,311

(22) PCT Filed: Apr. 13, 2011

(86) PCT No.: PCT/EP2011/055797
§ 371 (c)(1), (2), (4) Date: Dec. 18, 2012

(87) PCT Pub. No.: WO2011/141259
PCT Pub. Date: Nov. 17, 2011

(65) Prior Publication Data
US 2013/0088840 A1    Apr. 11, 2013

(30) Foreign Application Priority Data
Apr. 15, 2010 (DE) .......................... 10 2010 015 100

(51) Int. Cl.
*H05K 7/14* (2006.01)
*H02B 1/48* (2006.01)
(Continued)

(52) U.S. Cl.
CPC .............. *H05K 7/1427* (2013.01); *H02B 1/48* (2013.01); *H02J 3/1821* (2013.01); *Y02E 40/30* (2013.01)

(58) Field of Classification Search
USPC ......... 361/600, 601, 605, 611, 614, 622, 624, 361/626, 630, 631, 632, 636, 637, 642, 643, 361/646, 648, 658; 307/105, 10.1, 126; 363/39; 323/205, 207
See application file for complete search history.

(56) References Cited

U.S. PATENT DOCUMENTS 3,364,394 A * 1/1968 Metz .............................. 361/611
5,397,927 A * 3/1995 Suelzle et al. ................. 307/105
(Continued)

FOREIGN PATENT DOCUMENTS

| CN | 2847611 | 12/2006 |
| CN | 101557081 | 10/2009 |

(Continued)

OTHER PUBLICATIONS

International Search Report for PCT/EP2011/055797, English translation attached to original, Both completed by the European Patent on Feb. 9, 2012, All together 9 Pages.

*Primary Examiner* — Michail V Datskovskiy
(74) *Attorney, Agent, or Firm* — Brooks Kushman P.C.

(57) ABSTRACT

A module assembly for the application-specific construction of power factor correction, filter, and absorption circuit systems in selectively non-choked, choked, protective or thyristor-connected design, comprising a busbar system, fuse holders, switch components, at least one choke, and power capacitors. A first module unit has a first section for receiving busbars, fuse holders, fuses, a busbar cover as protection against accidental contact with the busbar, and a second, trough-like section for receiving switch components that can be mechanically fixed and electrically contacted. A second module unit is designed to receive switchable capacitor winding blocks, enclosing the at least one winding block, insulating the same. The first and the second module unit each have a base region, wherein mechanical and/or electrical connections are led via apertures in the base regions, such that either a back-to-back assembly with direct docking of the first and second module units can be affected.

20 Claims, 10 Drawing Sheets

(51) Int. Cl.
*H02J 3/18* (2006.01)
*H02B 1/26* (2006.01)

(56) References Cited

U.S. PATENT DOCUMENTS 5,483,148 A * 1/1996 Torrey ............................ 323/205
5,541,808 A    7/1996 Bastian
2008/0100993 A1 * 5/2008 Muller et al. ................ 361/624

FOREIGN PATENT DOCUMENTS

| CN | 201365073 | 12/2009 | |
|---|---|---|---|
| DE | 4208612 | 9/1993 | |
| DE | 019818472 A1 * | 11/1999 | ............... H01G 4/40 |

* cited by examiner

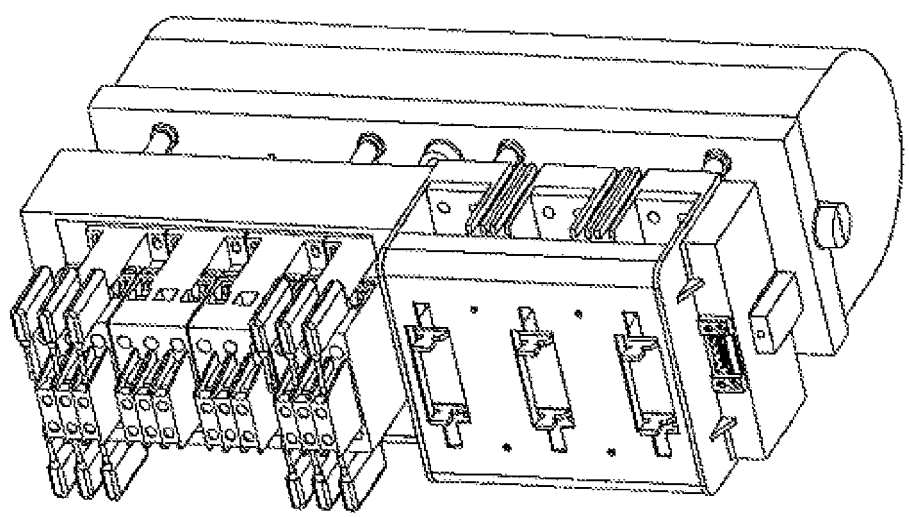
Figure 3.1

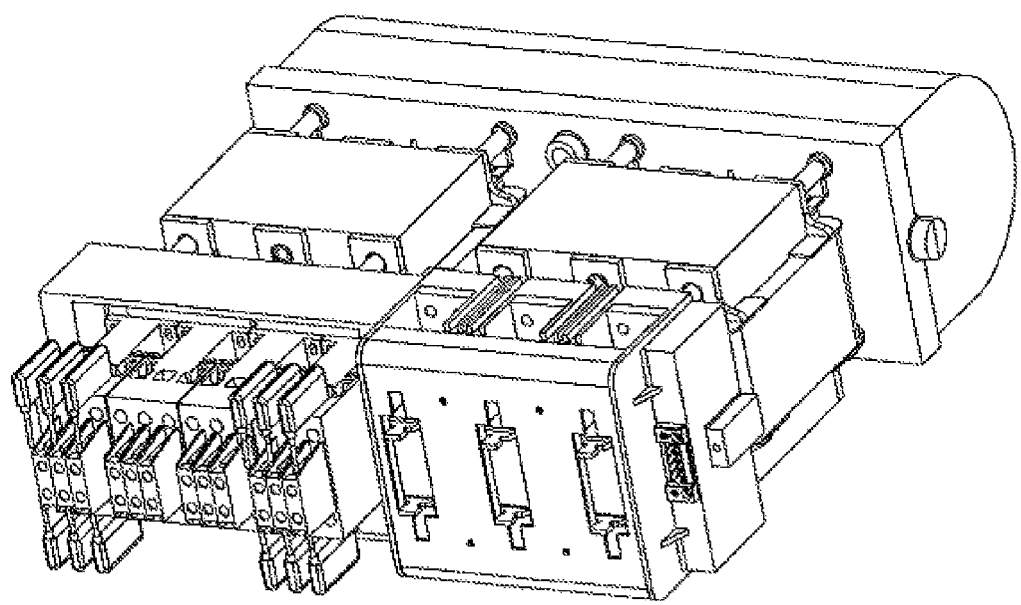
Figure 3.2

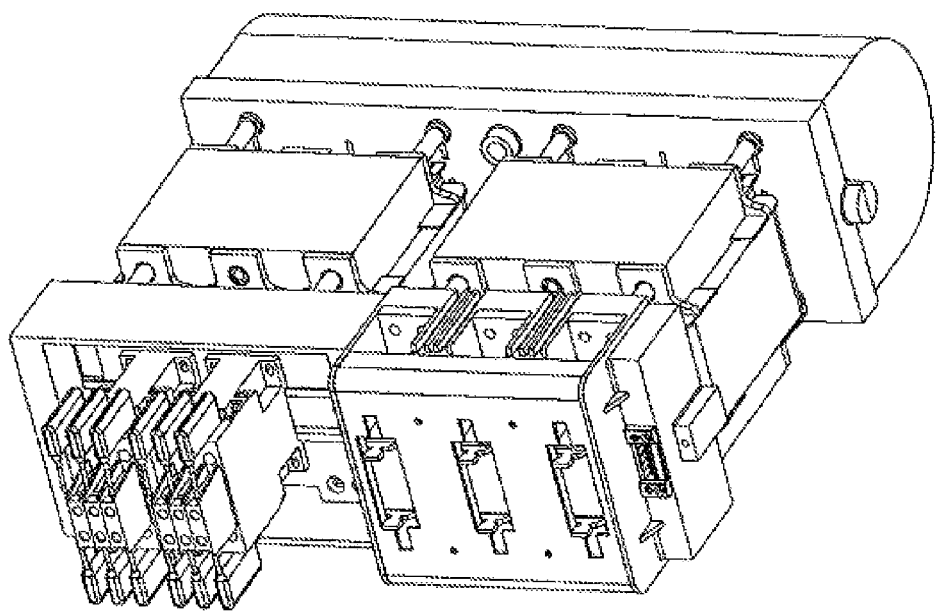
Figure 3.3

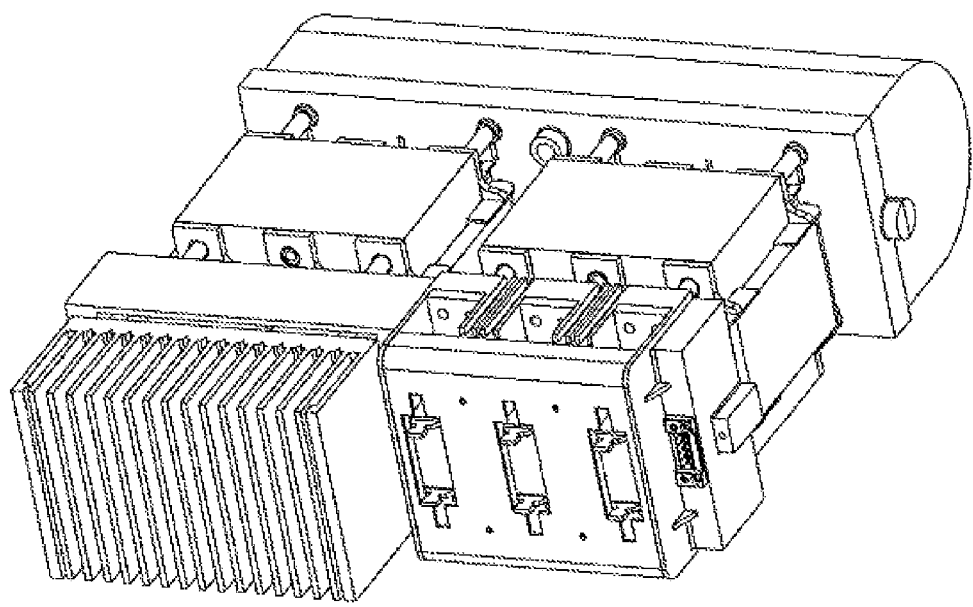
Figure 3.4

MODULE ASSEMBLY FOR THE APPLICATION-SPECIFIC CONSTRUCTION OF POWER FACTOR CORRECTION SYSTEMS, FILTER SYSTEMS, AND ABSORPTION CIRCUIT SYSTEMS

CROSS-REFERENCE TO RELATED APPLICATIONS

This application is the U.S. national phase of PCT Appln. No. PCT/EP2011/055797, now published WO 2011/141259, filed on Apr. 13, 2011, which claims priority to German Patent Application No. 10 2010 015 100.9 filed on Apr. 15, 2010, the disclosures of which are incorporated in their entirety by reference herein.

TECHNICAL FIELD

The invention relates to a module assembly for the application-specific construction of power factor correction filter and absorption circuit systems of selectively unchoked, choked, protective or thyristor-connected design, comprising a busbar system, fuse holders, switchgear devices, at least one choke and power capacitors.

BACKGROUND

Power factor correction systems of unchoked or choked design form part of the prior art. Systems of this kind are usually used in a connection-ready manner for central power factor correction in low-voltage three-phase power supply systems with a low or elevated harmonic loading. These systems generally comprise a busbar system with busbar supports and low-voltage high-breaking-capacity bus-mounting fuse elements, switchgear devices, chokes and low-loss, self-healing capacitors with overpressure prevention.

These individual elements are mounted on sheet steel support plates to form units of 25-150 kvar. Depending on the power, 1-6 such units are then usually installed in sheet steel or insulating material cabinets together with a power factor controller.

On account of the required assembly of busbar supports, busbars, fuse elements, discrete switchgear devices, filter circuit chokes and a relatively large number of capacitors and the required chassis, the total weight and the dimensions of correction modules of this kind, and of systems constructed from said correction modules, are considerable. Furthermore, the required individual assembly and the discrete wiring result in a high level of expenditure on assembly.

SUMMARY

Proceeding from the above, it is therefore the object of the invention to realize a further-developed module assembly for the application-specific construction of power factor correction filter and absorption circuit systems of selectively unchoked, choked protective or thyristor-connected design which enables optimum integration of the individual system components and a reduction in the number of individual parts, so that smaller, more lightweight, more reliable and more manageable systems can be realized in a quick and cost-effective manner overall.

The object of the invention is achieved by a module assembly.

for the application-specific construction of power factor correction filter and absorption circuit systems of selectively unchoked, choked protective or thyristor-connected design, comprising a busbar system, fuse elements, a finger-safe cover, switchgear devices, chokes and capacitors which are divided in respect of power.

BRIEF DESCRIPTION OF THE DRAWINGS

A first module unit with a first section for accommodating busbars, a busbar/fuse cover and standard fuse holders is provided according to the invention. Furthermore, the first module unit has a second, trough-like section, with switching means being accommodated in the trough-like section such that they can be mechanically fixed, electrical contact can be made with them and fingers are protected.

A second module unit serves to accommodate one or more, preferably two, capacitor winding blocks, with the second module unit surrounding the at least one capacitor winding block such that it is insulated. The first and second module unit each have a base region, with mechanical and/or electrical connections being guided in the respective base region via cutouts or openings such that either back-to-back assembly with direct docking of the first and second module unit can be performed or, as an alternative, a compact choke set with connection elements is mechanically accommodated and can be electrically connected between the first and second module unit using the cutouts or openings in the respective base region of the first or second module unit.

The at least one capacitor winding block comprises at least three self-healing individual windings with an internal series circuit, with a plurality of thermal fuses being arranged in series in the winding core tubes in a manner distributed over the longitudinal axis of said winding core tubes such that the critical regions of in each case two windings are monitored by a thermal fuse.

The fuses form a series circuit with a conductive casing which is insulated from the windings and completely or partially surrounds the windings, in order to effect all-pole interruption of the external supply of current to the capacitor winding block via the control circuit in the event of a fault.

In a refined embodiment, the capacitor winding connections are guided to the outside via the second module unit in order to create externally switchable partial capacitances. The internal connection to the capacitor windings and the interconnection thereof is performed without solder, by means of a novel spring-force contact-making process using a resilient material, but can also be performed by a soldered connection.

In capacitors from the prior art, the connections to the windings are established by means of a soldered or welded connection. This results in high loading on the capacitor film due to the high soldering temperatures and in additional loading on the winding due to the solder residues, and as a result has an adverse effect on the expected service life of the capacitor.

The assembly according to the invention further comprises a choke set comprising individual chokes which each have coil formers which have extensions with a hole, in order to enable attachment to the first and second module unit by means of a through-bolt or a through-screw, with the bolt or the screw additionally being guided within a hollow rivet, which stabilizes the choke prior to assembly, in the respective choke core.

The second section of the first module unit serves to accommodate the switching contactors or a power and control electronics system including the required cooling means, in particular a heat sink.

Means for insertion into and for attachment by means of top-hat rails are formed on the respective module units.

The invention will be explained in greater detail below with reference to an exemplary embodiment and with the aid of figures.

Figure 1:
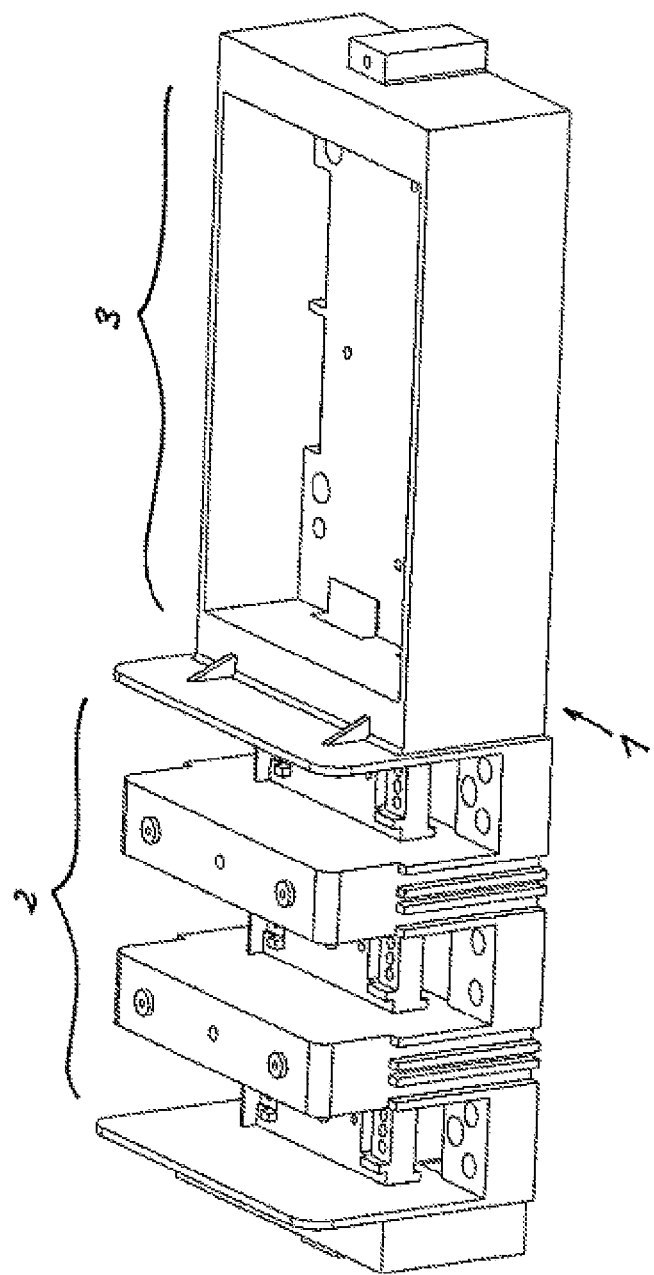
Figure 2:
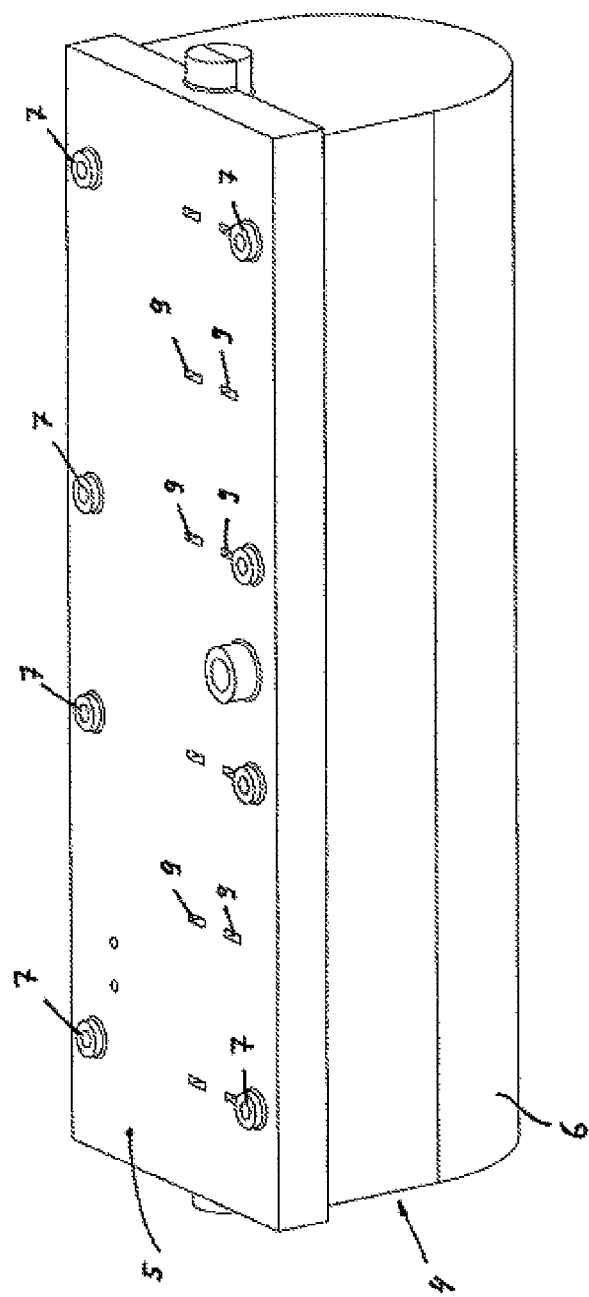
Figure 4:
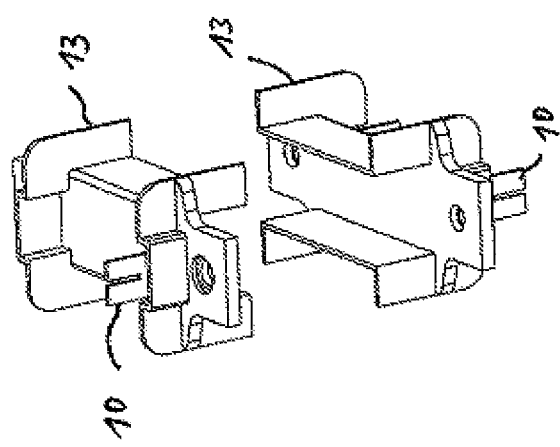
Figure 5:
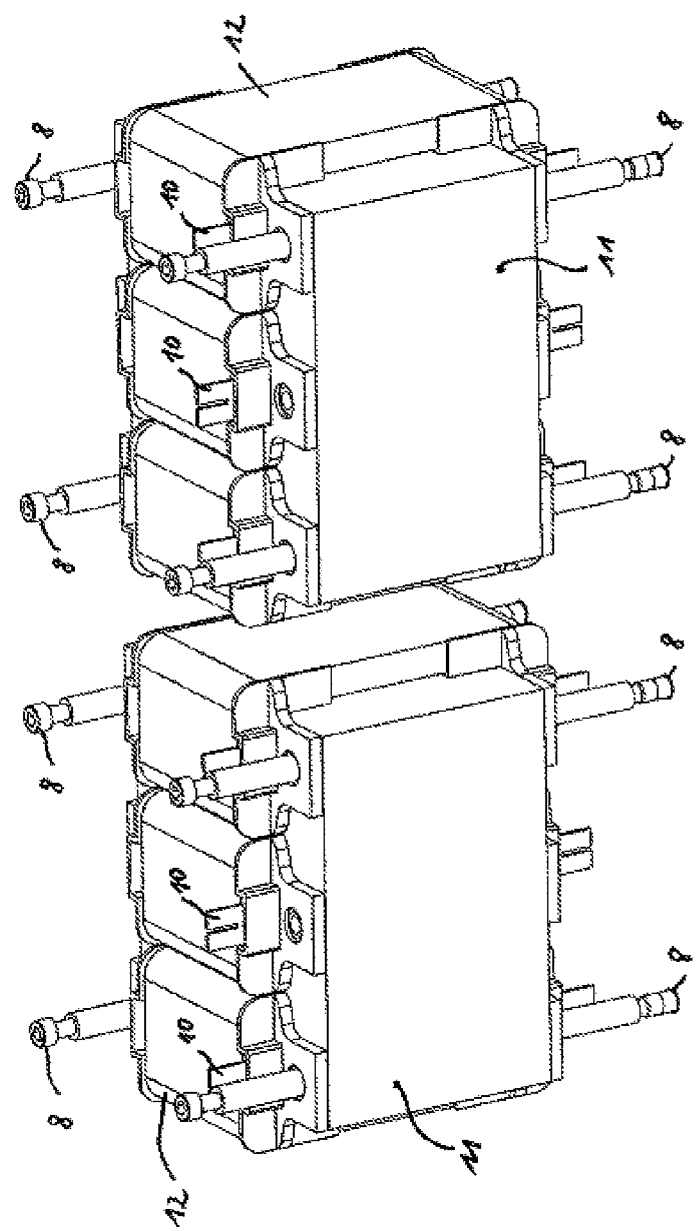
Figure 6:
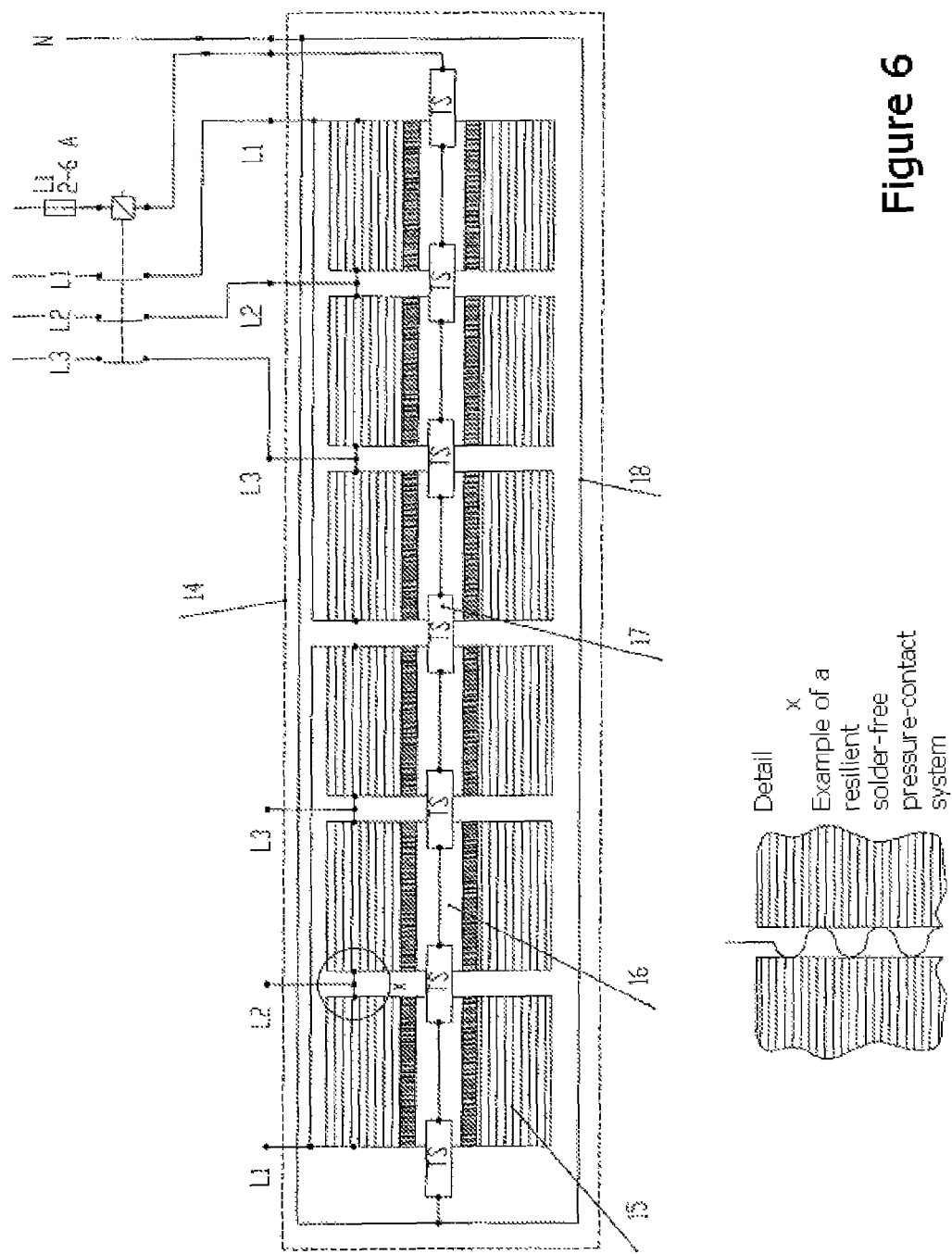
Figure 7:
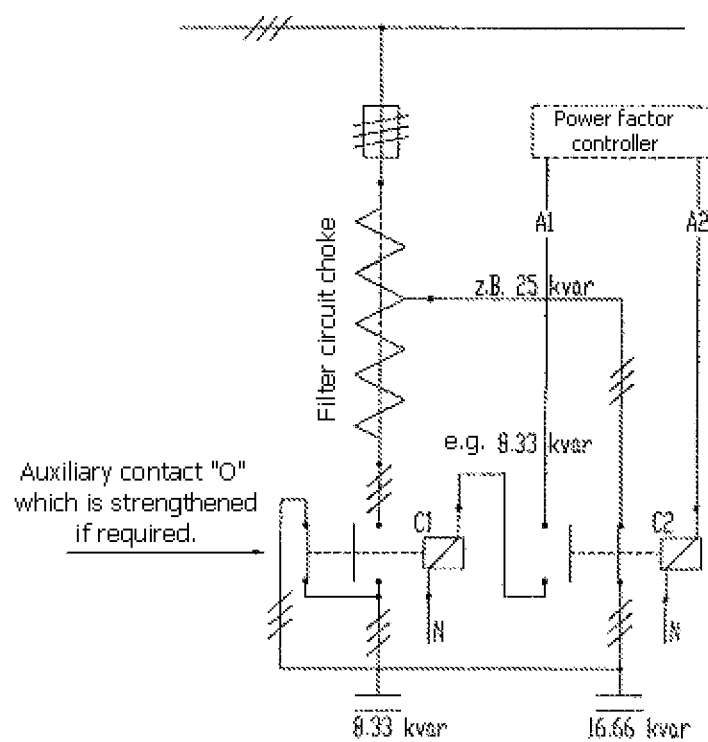

In said figures:

FIG. 1 shows a perspective illustration of the first module unit; for accommodating busbars, fuse holders and switchgear devices;

FIG. 2 shows a perspective illustration of the second module unit for accommodating at least one capacitor winding block;

FIGS. 3.1 to 3.4 (in the order FIG. 3.1 to FIG. 3.4) show module assemblies, which are realized in exemplary embodiments, without interposed chokes, with chokes which can be controlled, for example, in six stages of 8.33 kvar, with chokes which can be controlled, for example, in two stages of 25 kvar and can be controlled in two stages likewise of 25 kvar with power electronics (dynamically switching) and heat sinks within the second trough-like section of the first module unit;

FIG. 4 shows a perspective illustration of the connection coil former which serves to accommodate the winding and the iron core and to fix the yoke plate;

FIG. 5 shows an exemplary choke set of double 25 kvar design with visible bolts or attachment screws;

FIG. 6 shows a basic sectional illustration through the design of a capacitor winding assembly with protective loops, comprising thermal fuses TS, which are connected in series, and a conductive film; and FIG. 7 shows a specific capacitor circuit with tapped filter circuit choke, with each capacitor winding having a tap for, for example, 8.33 and 16.66 kvar, so that two partial powers can be achieved by means of one winding packet.

DETAILED DESCRIPTION

The inventive solution according to the figures and the exemplary embodiment initially proceeds from a first module unit 1 which comprises a first section 2 for accommodating a busbar system and standard fuse holders including a cover.

A second section 3 which is in the form of a trough is adjacent to said first section 2. Switching contacts or a power electronics system together with heat sinks for dynamic switching, as illustrated in FIG. 3, can be arranged in the trough-like second section 3.

The first module unit 1 comprises an injection-molded plastic or other materials with corresponding insulating properties. The chamber-like sections in the first section 2 serve to accommodate standard fuse holders and fuses and have means for accommodating busbars with simultaneous busbar and fuse covering.

The second module unit 4 is suitable for accommodating one or more capacitor winding blocks and surrounds at least one such winding block in an insulating manner.

The second module unit is preferably divided into two parts comprising a base region 5 and an insulating cap (capacitor housing) 6.

The base region 5 contains holes or leadthroughs 7 which serve to establish a mechanical electrically insulating connection to the first module unit 1. In particular, screw bolts 8 (see FIG. 5) can be received through said holes in order to fix a choke set on both sides in an insulated manner. Further slot-like openings 9 accommodate the electrical connections (connection lugs) 10 to the module unit 1 or to the choke set.

In a first embodiment of the invention, a back-to-back assembly between the first module unit 1 and the second module unit 4 is possible, as shown in FIG. 3, upper illustration. In said illustration according to FIG. 3, low-voltage high-breaking-capacity fuse elements are also already inserted into chambers of the first section 2 of the first module unit 1.

Furthermore, a compact choke set, as illustrated in FIG. 5, is according to the invention.

The choke set comprises in each case a choke core 11 and windings 12. Connection coil formers 13 almost in the form of two half-shells are likewise present (see FIG. 4). The choke set with connection elements can be mechanically accommodated, attached and electrically connected between the first and second module unit using cutouts or openings 7/9 in the respective base region of the first or second module unit.

The capacitor winding block which is located in the second module unit 4 can be constructed, for example, in the manner disclosed by the basic illustration according to FIG. 6.

A plurality of capacitor windings 15 are located in the indicated capacitor housing 14. The capacitor windings are wound onto core tubes 16.

A plurality of thermal fuses 17, which are connected in series and are able to interrupt a circuit when a prespecified limit temperature is exceeded, are located within the core tube 16 so as to overlap from winding to winding.

In addition, a neutral conductor return means which is insulated from the capacitor windings is formed as a conductive film or coating 18 which, completely or partially, encases all the capacitor windings.

As a result of this, a safety loop is realized from the series circuit of optimally positioned thermal fuses and the casing film in such a way that the temperature of each capacitor winding in the winding core and on the contact-making means is monitored on both sides. When the winding fuses, there is either a short circuit to the thermal fuse which is at N potential or to the conductive casing film 18 which is likewise at N potential.

A short circuit of any desired winding or any desired external conductor with the series circuit comprising thermal fuse/casing film or a critical temperature increase at any desired point of the safety loop leads either to a response by at least one thermal fuse or to a response by the upstream current fuse in the control circuit. A fuse of this kind can also be arranged within the capacitor housing, that is to say within the second module unit.

The failure of a thermal fuse or an internal short circuit with the necessary failure of the control fuse therefore always leads to de-energization (disconnection) of the capacitor switchgear devices. Therefore, the supply of current to the capacitor outside the capacitor housing is reliably interrupted at several poles, in the shown example at all poles, specifically in three phases.

In contrast, in the case of the safety concepts of the prior art with low-voltage power capacitors, the supply of current within the capacitor housing is interrupted, with the disadvantage that, in the case of a series of fault profiles, internal short circuits, with critical effects to the outside, cannot be precluded and critical winding fusing phenomena and temperature increases are only reacted to by means of a pressure increase relatively late. Simultaneous comprehensive monitoring of temperature and internal short circuits does not take place.

The windings of the capacitor can be designed such that, in the case of the three-phase system with three windings, two different or two identical three-phase partial powers are available. This is symbolized by connections of the windings being routed out according to FIG. 6.

The filter circuit chokes shown in FIGS. 4 and 5 are designed such that they can be attached in a magnetically and electrically insulated manner between device supports and capacitor by means of continuous screws or bolts which are guided through hollow rivets in the choke core.

Therefore, the chokes no longer constitute a component which is independent within the meaning of the prior art, but rather are a connecting and supporting element between the first and second module unit.

According to the exemplary embodiment, provision is made to form, instead of coil formers and connecting lugs for each coil, two connection coil former half-shells 13 which are of identical construction and are composed of insulating material and, since they are of two-part design, allow continuous adjustment to different core depths (choke powers) and replace known coil formers and connecting lugs such that the electrical and magnetic conditions which allow the choke to be used as a supporting and connecting element within the module assembly are provided with the aid of said hollow rivet screw connection. The main current connections between switchgear devices and choke block or between choke block and capacitor block can also be made using plugs. Coil formers according to the prior art do not have extensions with holes and do not have cutouts for connection lugs either, and therefore six connection lugs must additionally be arranged between the upper and lower yoke plate, and the connection lugs cannot be positioned accurately either.

Known three-phase filter circuit chokes generally have a power of 25 kvar or 50 kvar. Chokes of this kind require three windings for this purpose. Solutions in which the chokes have two generally identical partial powers of, for example, 12.5 kvar or 25 kvar are also known. In this case, six individual windings are usually required between two common yoke plates.

The solution according to the invention can use a, for example, 25 kvar choke with 3 windings to call up either the total inductance for capacitor powers of, for example, 8.33 kvar, 12.5 kvar or 16.66 kvar, or the partial inductance for the maximum capacitor power of, for example, 25 kvar. As a result, it is possible, for example with just two 25 kvar chokes with in each case three windings, to call up the total module power of 50 kvar in six steps of 8.33 kvar (8.33:25)-(16.66:25). This constitutes a significant advantage in the sense of a relatively small system with fine control.

The coil can be wound further with a correspondingly smaller cross section starting from the tap point for the partial inductance.

A capacitor circuit with tapped filter circuit choke is shown in FIG. 7.

In order to protect these tapped chokes and the system against overloading and critical shifts in inductance, it is ensured that in each case only the total power of the choke/capacitor combination, for example 25 kvar, or the respective partial power, for example 8.33 kvar, 12.5 kvar or 16.66 kvar, can be called up and switched. This is achieved with the locking and changeover protection combination according to FIG. 7 or by a corresponding power electronics circuit. Critical switching states are reliably precluded by means of software locking of the power factor controller.

Capacitor circuits according to the prior art do not have this locking and changeover combination. Known power factor controllers do not have software locking of this kind either.

Dynamic power factor correction systems are operated by means of thyristor switches. In known solutions, the thyristor switch is an independent, more or less large component which is mounted separately on a mounting plate.

In the solution presented according to FIG. 3, lower drawings, the second, trough-like section of the first module unit simultaneously forms the housing for the power and control electronics system of the thyristor switch and is a support for the high-power heat sink.

The present module assembly is considerably more lightweight and smaller than comparable power modules and can be attached without screws by a simple top-hat rail system with a stop and a spring. A complicated screwing operation can be dispensed with.

The described module assembly forms a novel system for power factor correction in highly integrated form, in which system all the relevant components are matched to one another in an optimum manner in respect of both their electrical and structural parameters. Individual components are allocated double functions here, for example in the sense of a mechanically supporting function for the choke set and the capacitor in addition to the inherent electrical parameters. In addition, the present correction system is able to ensure a high safety standard together with a reduced space requirement, cost-effective production and high planning security.

The capacitor block and busbar system with fuse holders and switchgear devices is no longer constructed from discrete independent components and capacitors as previously, but rather constitutes an independent, integral product together with the chokes.

The invention claimed is:

1. A module assembly for an application-specific construction of power factor correction filter and absorption circuit systems of selectively unchoked, choked protective or thyristor-connected design, comprising:
 a busbar system, fuse holders, switchgear devices, at least one choke and at least one power capacitor, wherein
 a first module unit with a first section for accommodating busbars, standard fuse holders, fuses and a busbar cover to protect against contact with the busbars and fuses, and a second section for accommodating at least one of switchgear devices and switching devices such that they can be mechanically fixed and electrical contact can be made with them;
 a second module unit for accommodating at least one capacitor winding block, with the second module unit surrounding the at least one capacitor winding block such that it is insulated,
 the first and second module units each having a base region, with at least one of a mechanical and electrical connection being guided in the respective base region via openings such that one of a back-to-back assembly with direct docking of the first and second module unit can be performed and a compact choke set with connection elements is mechanically accommodated and can be electrically connected, in an electrically insulated manner, between the first and second module unit via the openings in the respective base region of the first or second module unit, and
 wherein the choke includes individual chokes each having coil formers with at least one extension and a choke hole to enable attachment to the first and second module unit by at least one of a through-bolt and a through-screw being guided within a hollow rivet in the respective choke hole.

2. The assembly as claimed in claim 1, wherein the at least one capacitor winding block includes at least three self-healing individual windings, with a plurality of thermal fuses being arranged in series in winding core tubes in a manner distributed over a longitudinal axis of the winding core tubes such that in each case two windings are monitored by a common thermal fuse, each fuses forming a series circuit with at least one of a conductive film and coating, which at least partially surrounds the windings and is insulated from the windings, in order to effect all-pole interruption of an external supply of current to the at last one capacitor and to the winding block via a control circuit in response to a fault in the case of at least one of an excessive temperature and an internal short circuit.

3. The assembly as claimed in claim 2, wherein capacitor winding connections are guided to the outside at the second module unit in order to create externally switchable partial capacitances, wherein the second module unit is a capacitor housing and supports at least one of the at least one choke and the first module unit.

4. The assembly as claimed in claim 3, wherein the capacitor winding connections to the capacitor winding are realized by resilient pressure-contact systems without solder.

5. The assembly as claimed in claim 1, wherein the coil formers include two half-shells of identical construction.

6. The assembly as claimed in claim 1, further comprising a thermal fuse chain positioned so as to span windings within the winding block, in a series circuit with at least one of a conductive film and conductive coating which is insulated from the windings, and at least partially encases the windings wherein the series circuit is interrupted and the at least one capacitor is disconnected from a power supply system at all poles in response to at least one of an excessive temperature and an internal short circuit.

7. The assembly as claimed in claim 1, wherein each winding of a choke includes a tap for a partial inductance for a relatively high capacitor power, with a locking changeover circuit ensuring via the switchgear devices, that either only at least one of a partial inductance and a total inductance is connected to capacitors as required.

8. The assembly as claimed in claim 1, wherein the second section of the first module unit serves to accommodate at least one of the switchgear devices, a power system and a control electronics system including heat sinks for the latter.

9. The assembly as claimed in claim 1, wherein at least one of the first and second module units include top-hat rails for screwless attachment.

10. A module assembly for an application-specific construction of power factor correction filter and absorption circuit systems of selectively unchoked, choked protective or thyristor-connected design, comprising:
a busbar system, fuse holders, switchgear devices, at least one choke and at least one power capacitor, wherein
a first module unit with a first section for accommodating busbars, standard fuse holders, fuses and a busbar cover to protect against contact with the busbars and fuses, and a second section for accommodating at least one of switchgear devices and switching devices such that they are configured to be mechanically fixed and electrical contact can be made with them;
a second module unit for accommodating at least one capacitor winding block, with the second module unit surrounding the at least one capacitor winding block such that it is insulated,
the first and second module units each having a base region, with at least one of a mechanical connection and an electrical connection being guided in the respective base region via openings such that one of a back-to-back assembly with direct docking of the first and second module unit can be performed and a compact choke set with connection elements is mechanically accommodated and can be electrically connected, in an electrically insulated manner, between the first and second module unit via the openings in the respective base region of the first or second module unit, and wherein at least one of the first and second module units include top-hat rails for screwless attachment.

11. The assembly as claimed in claim 10, wherein the at least one capacitor winding block includes at least three self-healing individual windings, with a plurality of thermal fuses being arranged in series in winding core tubes in a manner distributed over a longitudinal axis of the winding core tubes such that in each case two windings are monitored by a common thermal fuse, each fuse forming a series circuit with at least one of a conductive film and coating, which at least partially surrounds the windings and is insulated from the windings, in order to effect all-pole interruption of an external supply of current to the at last one capacitor and to the winding block via a control circuit in response to a fault in the case of at least one of an excessive temperature and an internal short circuit.

12. The assembly as claimed in claim 11, wherein the capacitor winding connections to the capacitor winding are realized by resilient pressure-contact systems without solder.

13. The assembly as claimed in claim 10, wherein the choke includes individual chokes each having coil formers with at least one extension and a choke hole to enable attachment to the first and second module unit by at least one of a through-bolt and a through-screw being guided within a hollow rivet in the respective choke hole.

14. The assembly as claimed in claim 13, wherein the coil formers include two half-shells of identical construction.

15. The assembly as claimed in claim 10, further comprising a thermal fuse chain positioned so as to span windings within the winding block, in a series circuit with at least one of a conductive film and conductive coating which is insulated from the windings, and at least partially encases the windings wherein the series circuit is interrupted and the at least one capacitor is disconnected from a power supply system at all poles in response to at least one of an excessive temperature and an internal short circuit.

16. The assembly as claimed in claim 10, wherein each winding of a choke includes a tap for a partial inductance for a relatively high capacitor power, with a locking changeover circuit ensuring via the switchgear devices, that either only at least one of a partial inductance and a total inductance is connected to capacitors as required.

17. The assembly as claimed in claim 10, wherein the second section of the first module unit serves to accommodate at least one of the switchgear devices, a power system and a control electronics system including heat sinks for the latter.

18. A module assembly for an application-specific construction of power factor correction filter and absorption circuit systems of selectively unchoked, choked protective or thyristor-connected design, comprising:
a busbar system, fuse holders, switchgear devices, at least one choke and at least one power capacitor, wherein
a first module unit with a first section for accommodating busbars, standard fuse holders, fuses and a busbar cover to protect against contact with the busbars and fuses, and a second section for accommodating at least one of the switchgear devices and switching devices such that they are configured to be mechanically fixed and electrical contact can be made with them;
a second module unit for accommodating at least one capacitor winding block, with the second module unit surrounding the at least one capacitor winding block such that it is insulated,
the first and second module units each having a base region, with at least one of a mechanical connection and an electrical connection being guided in the respective base region via openings such that one of a back-to-back assembly with direct docking of the first and second module unit can be performed and a compact choke set with connection elements is mechanically accommodated and can be electrically connected, in an electrically insulated manner, between the first and second module unit via the openings in the respective base region of the first or second module unit, and wherein the at least one capacitor winding block includes at least three self-healing individual windings, with a plurality of thermal fuses being arranged in series in winding core tubes in a manner distributed over a longitudinal axis of the winding core tubes such that in each case two windings are monitored by a common thermal fuse, each fuse forming a series circuit with at least one of a conductive film and coating, which at least partially surrounds the windings and is insulated from the windings, in order to effect all-pole interruption of an external supply of current to the at last one capacitor and to the winding block via a control circuit in response to a fault in the case of at least one of an excessive temperature and an internal short circuit.

19. The assembly as claimed in claim 18, wherein the capacitor winding connections to the capacitor winding are realized by resilient pressure-contact systems without solder.

20. The assembly as claimed in claim 18, wherein the second section of the first module unit serves to accommodate at least one of the switchgear devices, a power system and a control electronics system including heat sinks for the latter.

* * * * *

UNITED STATES PATENT AND TRADEMARK OFFICE
CERTIFICATE OF CORRECTION

PATENT NO. : 9,013,862 B2
APPLICATION NO. : 13/641311
DATED : April 21, 2015
INVENTOR(S) : Klaus Holbe et al.

Page 1 of 1

It is certified that error appears in the above-identified patent and that said Letters Patent is hereby corrected as shown below:

In the Claims

Column 6, Line 66, Claim 2:

After "common thermal fuse, each"
Delete "fuses" and
Insert -- fuse --.

Column 6, Line 66, Claim 2:

After "current to the at"
Delete "last" and
Insert -- least --.

Signed and Sealed this
Eighth Day of September, 2015

Michelle K. Lee
*Director of the United States Patent and Trademark Office*